(12) United States Patent
Lee

(10) Patent No.: US 10,593,613 B2
(45) Date of Patent: Mar. 17, 2020

(54) LEAD FRAME AND SEMICONDUCTOR PACKAGE INCLUDING THE SAME

(71) Applicant: BK Technology Co., Ltd, Gyeonggi-do (KR)

(72) Inventor: Dong-Woo Lee, Gyeonggi-do (KR)

(73) Assignee: BK Technology Co., Ltd., Gyeonggi-do (KR)

(*) Notice: Subject to any disclaimer, the term of this patent is extended or adjusted under 35 U.S.C. 154(b) by 0 days.

(21) Appl. No.: 15/555,359

(22) PCT Filed: Mar. 4, 2015

(86) PCT No.: PCT/KR2015/002091
§ 371 (c)(1),
(2) Date: Sep. 1, 2017

(87) PCT Pub. No.: WO2016/140383
PCT Pub. Date: Sep. 9, 2016

(65) Prior Publication Data
US 2018/0068933 A1    Mar. 8, 2018

(30) Foreign Application Priority Data

Mar. 2, 2015    (KR) .................. 10-2015-0029253

(51) Int. Cl.
*H01L 23/495*    (2006.01)
*H01L 33/62*    (2010.01)
(Continued)

(52) U.S. Cl.
CPC ...... *H01L 23/49568* (2013.01); *H01L 23/315* (2013.01); *H01L 23/495* (2013.01);
(Continued)

(58) Field of Classification Search
CPC ............ H01L 23/49568; H01L 23/495; H01L 23/49575; H01L 33/62; H01L 33/64;
(Continued)

(56) References Cited

U.S. PATENT DOCUMENTS

2011/0284900 A1   11/2011   Kim
2012/0074451 A1    3/2012   Lin
2013/0021789 A1*   1/2013   Dahm ................... B05D 3/067
                                                          362/184

FOREIGN PATENT DOCUMENTS

JP    2013-058695 A    3/2013
KR    10-1193909 B1    10/2012
(Continued)

OTHER PUBLICATIONS

International Search Report of PCT/KR2015/002091, dated Nov. 27, 2015.

*Primary Examiner* — Feifei Yeung Lopez
(74) *Attorney, Agent, or Firm* — Blank Rome LLP

(57) ABSTRACT

Disclosed are a lead frame for a semiconductor package, comprising: an anode 10, a cathode 20, a molding part 30, terminal parts 90 and 91, wherein one or more heat radiating holes 40, one or more chip attachment parts 50 which have a wider surface area than surface areas of semiconductor chips 55 to be attached, one or more upper openings 70 and 71 are positioned in an upper portion of the lead frame, and wherein one or more heat radiating holes 40, one or more first lower openings 60, and one or more second lower openings 80 are positioned in a lower portion of the lead frame; a semiconductor package including the lead frame; and a lighting apparatus including the semiconductor package.

11 Claims, 4 Drawing Sheets

(51) Int. Cl.
  *H01L 33/64* (2010.01)
  *H01L 23/31* (2006.01)
  *H01L 25/075* (2006.01)
  *F21Y 115/10* (2016.01)
  *F21S 4/00* (2016.01)
  *F21Y 103/10* (2016.01)

(52) U.S. Cl.
  CPC ........ *H01L 23/49575* (2013.01); *H01L 33/62* (2013.01); *H01L 33/64* (2013.01); *H01L 33/642* (2013.01); *H01L 33/647* (2013.01); *F21S 4/00* (2013.01); *F21Y 2103/10* (2016.08); *F21Y 2115/10* (2016.08); *H01L 25/0753* (2013.01); *H01L 2224/48091* (2013.01); *H01L 2224/48247* (2013.01); *H01L 2224/48465* (2013.01)

(58) Field of Classification Search
  CPC ..... H01L 33/642; H01L 33/647; H01L 23/28; H01L 23/315
  See application file for complete search history.

(56) References Cited

FOREIGN PATENT DOCUMENTS

KR   10-1340029 B1   12/2013
KR   101340029 B1 *  12/2013

\* cited by examiner

[FIG. 1]
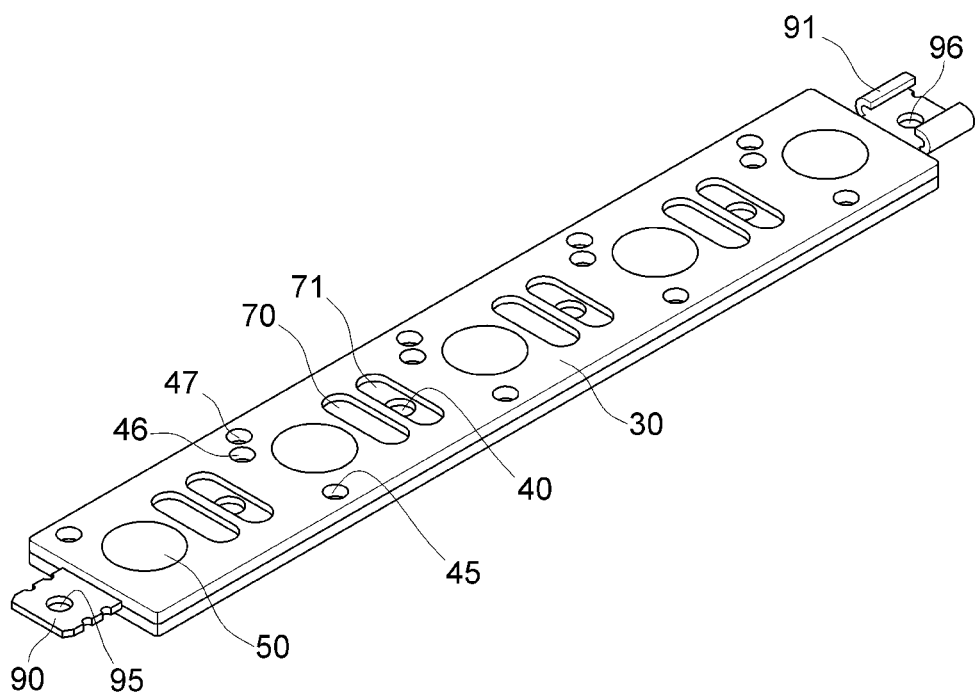

[FIG. 2]
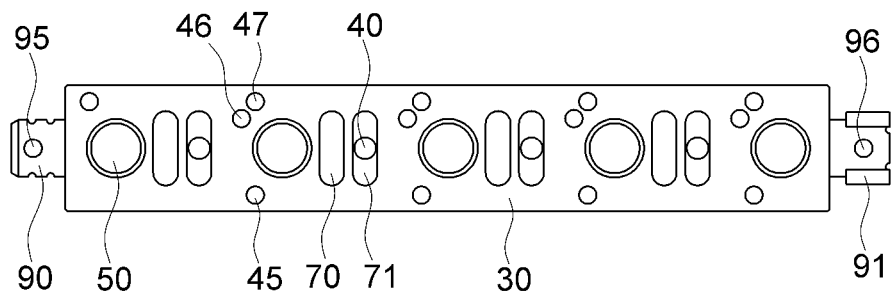
[FIG. 3]
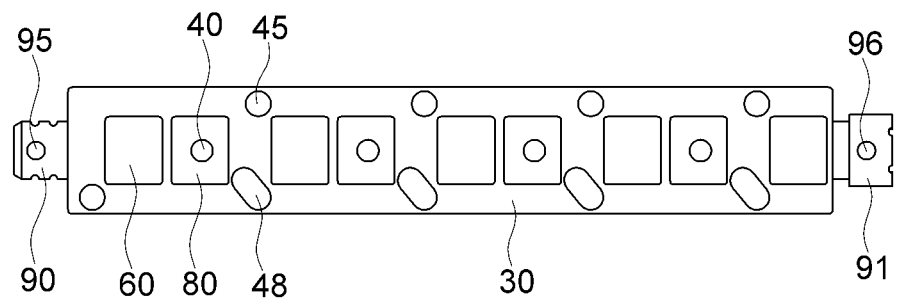

[FIG. 4]
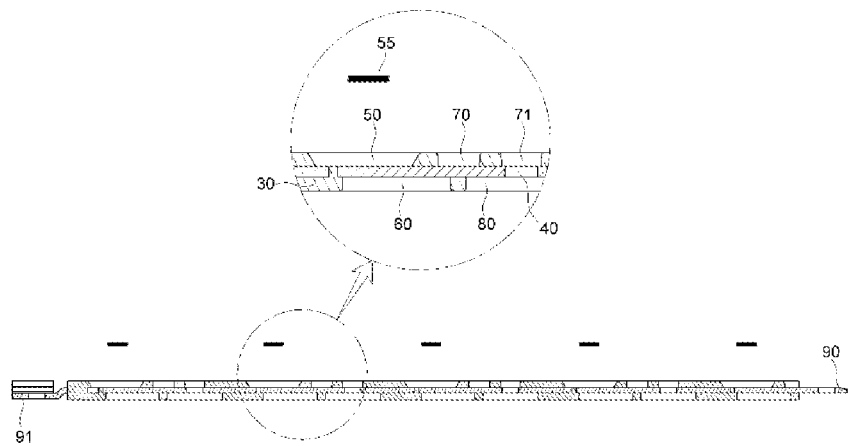
[FIG. 5]
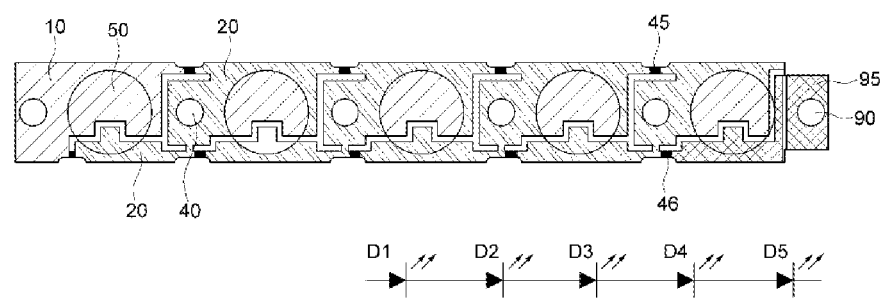

[FIG. 6]
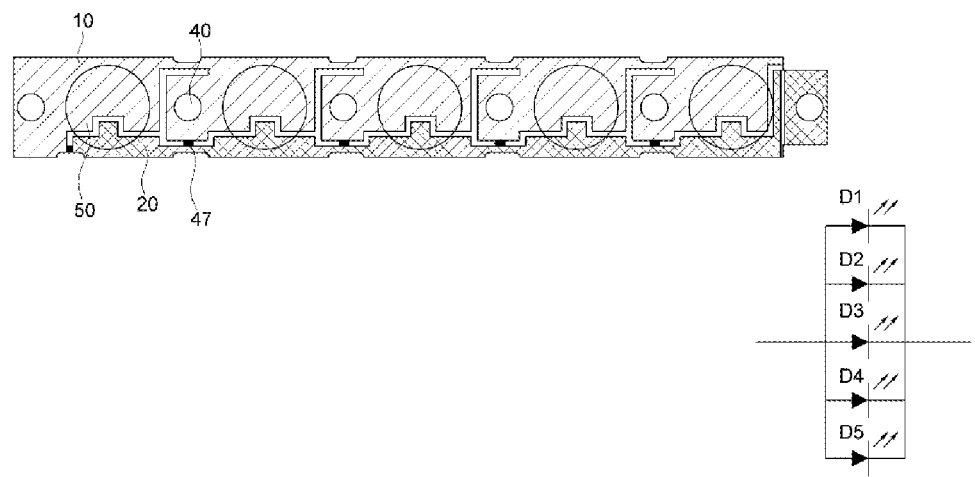
[FIG. 7]
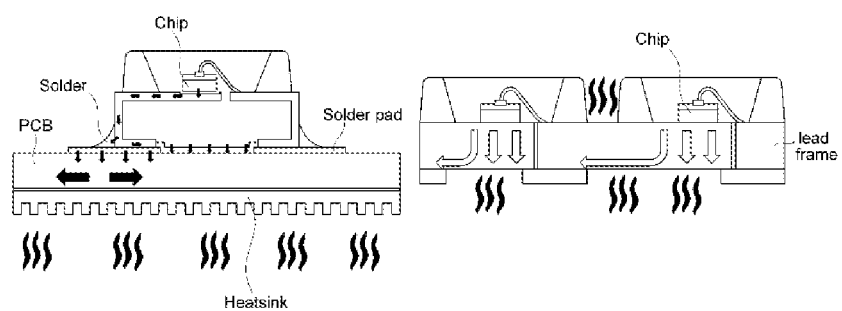

LEAD FRAME AND SEMICONDUCTOR PACKAGE INCLUDING THE SAME

RELATED APPLICATIONS

This application is a national phase of PCT/KR2015/002091, filed on Mar. 4, 2015, which claims the benefit of Korean Patent Application No. 10-2015-0029253, filed on Mar. 2, 2015. The contents of those applications are hereby incorporated by reference.

TECHNICAL FIELD

The present invention relates to a lead frame and a semiconductor package including the same. More particularly, the invention relates to a lead frame for a semiconductor package, which has an excellent heat radiating characteristic thereby being capable of preventing degradation of a semiconductor device and improving reliability and efficiency of a semiconductor device; and a semiconductor package including the same.

BACKGROUND ART

A lead frame is a metal substrate supporting a semiconductor chip. The lead frame is widely used for packaging a semiconductor device in an electronic component field. Recently, a semiconductor package, wherein a semiconductor device (for example, a lighting emitting diode (LED) chip) is mounted in the lead frame and a sealing material is injected, is used in various fields. The lead frame may be applied in various applications according to a form and a size thereof.

A light emitting diode (LED) among the semiconductors has been recently widely used because of its long life and eco-friendly characteristic. Particularly, in a lighting field, a usage of the LED is gradually increased by reason of a price fall of the LED, an incandescent light bulb ban and a fluorescent light bulb ban in each country, and the like.

However, the LED itself generates the large amount of heat, so that an LED package may cause a problem such as a defective product, degradation of a product quality and a decrease in product life, due to degradation of a thermal property.

Accordingly, in designing the semiconductor package, particularly, the LED package, a heat radiation design is very important. The important point is how to design the heat radiation structure so that heat is dischargeable to the outside by effectively transmitting thermal energy caused by a temperature difference.

In general, the heat radiation of a product has been accomplished by based on the view that considers the semiconductor device and the lead frame as one package, designing a printed circuit board (PCB) made of a metal or ceramic having high thermal conductivity, and then attaching a heat sink or a heat radiating means made of a metal onto a rear portion of the PCB. Heat generated in the package may be discharged to air through the PCB and the heat radiating means.

As described above, the prior art lead frame package is a structure accommodating the semiconductor chip in accordance with its size and shape and cannot be used itself. It may be used only through a heat radiation design such as an additional circuit design and a heat sink. That is, most of the LED packages discharge heat of the LED device to air through a separate heat radiating means such as a heat sink.

However, most of the LED products including a separate heat radiating means such as heat sink, have a large volume and limitations in a form, a shape, and a usage of a product due to a volume and a shape of the separate heat radiating means itself. Accordingly, the LED product so far has problems in that the product has a large volume, the product is heavy, a manufacturing time of the product is long, and the like.

In order to solve the problem, Korean Patent No. 1,340,029 discloses a technology of a lead frame for a semiconductor package, which is capable of providing excellent semiconductor chip performance even without using a separate heat radiating means. The patent is different from the prior art semiconductor package in that a lead frame itself is used as a heat radiating means. However, in the patent, a heat radiating characteristic of the lead frame is not still satisfied. Accordingly, a semiconductor package having a more excellent heat radiating characteristic has been demanded.

DISCLOSURE

Technical Problem

The present invention has been made in an effort to solve a disadvantage of the lead frame in the prior art, and an object of the present invention is to provide a lead frame for a semiconductor package, which may guarantee reliability and efficiency even over long-time usage, has an excellent heat radiating characteristic itself without a separate heat radiation means, and has low manufacturing costs and improved durability; and a semiconductor package including the same.

Technical Solution

An exemplary embodiment of the present invention provides a lead frame for a semiconductor package, the lead frame comprising: one or more anodes 10 and one or more cathodes 20 which are disposed while being spaced apart from each other; a molding part 30 which seals the anode 10 and the cathode 20; terminal parts 90 and 91 which are disposed at distal ends of the anode 10 and the cathode 20, respectively; one or more heat radiating holes 40 which are formed in an upper portion and a lower portion of the lead frame, and pass through the anode 10 and/or the cathode 20, and the molding part 30; one or more chip attachment parts 50 which are formed in the upper portion of the lead frame and have a wider surface area than those of semiconductor chips 55 to be attached; one or more upper openings 70 and 71, which are formed in the upper portion of the lead frame, are not sealed by the molding part 30, and expose the anode 10 or the cathode 20 to the outside; one or more first lower openings 60, which are formed at positions corresponding to the chip attachment parts 50 in the lower portion of the lead frame, are not sealed by the molding part 30, and expose the anode 10 or the cathode 20 to the outside; and one or more second lower openings 80, which are formed at positions corresponding to the upper openings 70 in the lower portion of the lead frame, are not sealed by the molding part 30, and expose the anode 10 or the cathode 20 to the outside.

Another exemplary embodiment of the present invention provides a semiconductor package including a semiconductor chip and a lead frame electrically connected with the semiconductor chip, and still exemplary embodiment of the present invention provides a lighting apparatus including the semiconductor package.

Advantageous Effects

According to the exemplary embodiment of the present invention, it is possible to provide the lead frame for a semiconductor package having high reliability, which is capable of securing reliability and efficiency even over long-time usage by preventing a semiconductor device from being degraded; and the semiconductor package including the lead frame.

According to the exemplary embodiment of the present invention, it is possible to provide the lead frame for a semiconductor package having high reliability, which itself has an excellent heat radiating characteristic without a separate heat radiating means; and the semiconductor package including the lead frame.

According to the exemplary embodiment of the present invention, it is possible to provide the lead frame for a semiconductor package having high reliability, which has a simple manufacturing process and may be manufactured with low costs; and the semiconductor package including the lead frame.

DESCRIPTION OF DRAWINGS

FIG. 1 is a perspective view of a lead frame according to an exemplary embodiment of the present invention.

FIG. 2 is a top plan view of the lead frame.

FIG. 3 is a bottom view of the lead frame.

FIG. 4 is a lateral view and an enlarged view of a lateral surface of the lead frame.

FIG. 5 is a diagram illustrating a state, in which electrodes are serially disposed, according to an exemplary embodiment of the present invention.

FIG. 6 is a diagram illustrating a state, in which electrodes are disposed in parallel, according to an exemplary embodiment of the present invention.

FIG. 7 is a view illustrating heat radiating characteristics of the lead frames of the prior art and the present invention.

DETAILED DESCRIPTION

Hereinafter, an exemplary embodiment of the present invention will be described in detail with reference to the accompanying drawings. However, the exemplary embodiment of the present invention may be modified in various forms, and the scope of the present invention is not limited to an exemplary embodiment to be described below.

FIGS. 1 to 3 illustrate a lead frame according to an exemplary embodiment of the present invention.

As illustrated in FIGS. 1 to 3, the lead frame comprises: one or more anodes 10 and one or more cathodes 20 (not illustrated in FIGS. 1 to 3) which are spaced apart from each other; a molding part 30 which seals the anode 10 and the cathode 20; and terminal parts 90 and 91 which are disposed at distal ends of the anode 10 and the cathode 20, respectively.

As illustrated in FIGS. 1 and 2, chip attachment parts 50 may be formed in an FIG. upper portion, that is, a front portion, of the lead frame, so that the semiconductor chips may be attached to the chip attachment parts 50. Heat radiating holes 40 for radiating heat are formed in the upper portion of the lead frame. Further, as illustrated in FIGS. 1 and 2, one or more upper openings 70 and 71, which are not sealed by the molding part 30 and expose the anode 10 and the cathode 20 to the outside, are formed in the upper portion of the lead frame. Separate fastening holes 95 and 96 are formed at electrodes of both ends of the lead frame, so that the lead frames may be connected with each other. It is desirable to form electrode isolating holes 45, 46, and 47 which electrically isolate the anode 10 and the cathode 20, in the upper portion of the lead frame.

FIG. 3 is a bottom view of the lead frame. As illustrated in FIG. 3, first lower openings 60 are formed at positions corresponding to the upper chip attachment parts 50 in a lower portion, that is, a rear portion, of the lead frame. The first lower opening 60 is a region, which is not sealed by the molding part 30 and exposes the anode 10 to the outside. The opening 60 for radiating heat is for radiating heat generated from the semiconductor chip. It is preferable to form the opening 60 to have a wider region than that of the chip attachment part 50 so as to cover an entire region corresponding to the chip attachment part 50.

Further, in a lower portion of the lead frame, the heat radiating holes 40 which pass through the molding part 30 and the electrodes 10 and 20 from the upper portion of the lead frame, are provided, as illustrated in FIG. 4, Also, in the lower portion, second lower openings 80 through which the electrodes 10 and 20 are not molded and are exposed, are further formed in regions surrounding the heat radiating holes 40. The first lower openings 60 and the second lower openings 80 may more easily radiate heat generated from the semiconductor chips 55, together with the heat radiating holes 40.

As illustrated in FIG. 3, it is preferable to in the lower portion form the electrode isolating holes 45 and 48 which pass through the lead frame from the upper portion of the lead frame and electrically isolate the anode 10 and the cathode 20.

Hereinafter, each constituent element of the lead frame will be described.

Anode 10 and Cathode 20

In the present invention, one or more anodes 10 and cathodes 20 may be used.

Various conductive metals may be used as the anode 10 and the cathode 20, and the kind of conductive metal is not particularly limited. For example, copper, aluminum, and the like may be used. Graphene and ceramic may also be used. Further, the aforementioned materials may be used in combination.

The anode 10 and the cathode 20 may be preferably formed of a single layer shaped like a flat plate.

The anode 10 and the cathode 20 may be fastened by various methods known in the art. The fastening method may include a screw fastening method, a male-female fastening method, and the like, and is not limited. However, the male-female fastening method is preferable. The reason is that a separate screw is not needed, so that an operation is much simpler and manufacturing cost may also be decreased.

Molding Part 30

The molding part 30 is an injection molding product sealing the anode 10 and the cathode 20. That is, the anode 10 and the cathode 20 are formed in structures inserted into the molding part 30.

Terminal Parts 90 and 91

The terminal parts 90 and 91 for applying power are exposed without being molded at the electrodes at both ends of the lead frame. The lead frame may be electrified with the outside through the terminal parts 90 and 91. The terminal parts 90 and 91 at both distal ends of the lead frame have male-female structures, so that the lead frames may be connected by the male-female fastening method. It is desirable that the fastening holes 95 and 96 are formed in the terminal parts 90 and 91, respectively. The fastening holes 95 and 96 may discharge heat accumulated in the terminal parts 90 and 91 to the outside, so that the fastening holes 95 and 96 may also be referred to as a sort of heat radiating holes.

Heat Radiating Hole 40

As illustrated in FIGS. 1 to 4, the heat radiating hole 40 passes through the lead frame from the upper portion to the lower portion. That is, the heat radiation hole 40 passes through the anode 10 and/or the cathode 20 and the molding part 30. The lead frame includes one or more heat radiating holes 40. The heat of the lead frame may be discharged to the outside through the heat radiating hole 40. Particularly, since the heat radiating hole 40 passes through the lead frame from the upper portion to the lower portion, heat may be discharged to both the upper portion and the lower portion, thereby enhancing a heat radiating effect.

At least one of the heat radiating holes 40 is formed to pass through the upper opening 71 and the second lower opening 80 (see FIG. 4). The heat radiating hole 40 if formed to passe through the openings 71 and 80, so that an air flow may be formed and heat may be discharged in both directions, thereby enhancing an effect of temperature improvement. To this end, it is preferable that the heat radiating hole 40 is formed at a center of the upper opening 71.

Electrode Isolating Holes 45, 46, and 47

The electrode isolating hole 45 electrically isolating the anode and the cathode is formed to simultaneously passes through the anode 10 and/or the cathode 20, and the molding part 30, at a portion in which the anode 10 is adjacent to the cathode 20.

A size and the number of the electrode isolating holes 45 may be adjusted according to a purpose, for example, of a serial disposition and of a parallel disposition. For example, two or more electrode isolating holes are provided per package, so that the electrodes may be easily disposed in serial or in parallel without a change of the lead frame. A diameter of the electrode isolating hole 45 is not limited, but is preferably 5 mm or less. FIG. 1 illustrates the lead frame including the three electrode isolating holes 45, 46, and 47 as the lead frame, but the lead frame may also be formed so as to selectively include one electrode isolating hole or two electrode isolating holes.

Chip Attachment Part 50

The chip attachment part 50 is connected with the semiconductor chip to serve to conduct electricity. As illustrated in FIGS. 1 and 2, the lead frame includes one or more chip attachment parts 50 which are formed in the upper portion thereof and have a wider surface area than that of the semiconductor chip 55 to be attached. Herein, the surface area of the chip attachment part 50 may be adjusted according to a heat radiating characteristic of the semiconductor chip 55 to be attached. It is preferable that the surface area of the chip attachment part 50 is 2.5 times larger than that of the semiconductor chip 550 to be attached.

The chip attachment part 50 is a portion, to which the heat generating semiconductor chip or LED chip is attached, and corresponds to a heat generating part. In the exemplary embodiment of the present invention, the semiconductor chip 55 is utilized as a direct heat radiating means by increasing a mounted area of the semiconductor chip 55. Particularly, in the exemplary embodiment of the present invention, a surface area of the metal electrode part is increased, that is, the mounted area of the semiconductor chip 55 is enlarged, so that a heat conductivity coefficient is higher and free electrons are movable better, thereby increasing heat resistance and improving a heat radiating effect. Here, the heat resistance is in proportional to heat conductivity and an area.

As described above, in the present invention, since the chip attachment part 50 functions as both a heat generating part and a heat discharging part, heat may be rapidly discharged to the outside. That is, the present invention is characterized in that a heat generating part and a heat radiating part are integrated, so that a heat resistor body is removed.

The number of semiconductor chips 55 to be attached is not particularly limited, and is determined considering a light quantity, a heat radiating effect, and the like. In order to use lead frame mass-producing equipment as it is, which has been used in the existing package technology, the number of semiconductor chips may be appropriately adjusted.

Upper Openings 70 and 71

As illustrated in FIGS. 1 and 2, the lead frame includes the one or more upper openings 70 and 71, which are formed in the upper portion of the lead frame, are not sealed by the molding part 30, and expose the anode 10 or the cathode 20 to the outside. The electrodes are directly in contact with the outside air through the upper openings 70 and 71, so that a heat radiating effect may be improved. Although the lead frame in the prior art has the opening in the lower portion of the lead frame, the lead frame according to the exemplary embodiment of the present invention includes the upper openings 70 and 71, in addition to the lower opening, resulting in that heat may be discharged in both directions thereby remarkably improving a heat radiating effect. When the heat generated in the semiconductor chip or the LED device is transmitted to the anode or the cathode, the heat may also be discharged upward, as well as downward, thereby maximizing a heat radiating effect.

The heat radiating hole 40 may be formed in one upper opening 71 of the upper openings. Accordingly, it is possible to further improve a heat radiating effect. The heat radiating hole 40 is formed while passing through the opening 71, so that an air flow may be formed, and heat may be discharged in both directions, thereby improving an effect of temperature improvement.

First Lower Opening 60

As illustrated in FIG. 3, the lead frame includes the one or more first lower openings 60, which are formed at the positions corresponding to the chip attachment parts 50 in the lower portion of the lead frame, are not sealed by the molding part 30, and expose the anode 10 to the outside.

As described above, the chip attachment part 50 corresponds to the heat generating part which generates heat. According to the exemplary embodiment of the present invention, as illustrated in FIGS. 2 and 3, the first lower opening 60 is provided at the position corresponding to the chip attachment part 50, so that heat generated from the chip may be discharged to the lower portion of the lead frame through the first lower opening 60. Accordingly, the first lower opening 60 also serves to improve a heat radiating effect.

Second Lower Opening 80

As illustrated in FIG. 3, the lead frame includes the one or more second lower openings 80, which are formed at the positions corresponding to the upper openings 70 and 71 in the lower portion of the lead frame, are not sealed by the molding part 30, and expose the anode 10 and the cathode 20 to the outside.

The second lower opening 80 also serves to improve a heat radiating effect by exposing the anode 10 and the cathode 20 to the outside. Since the second lower openings 80 are disposed at the positions corresponding to the two upper openings 70 and 71, it is preferable that the second lower openings 80 have larger areas than those of the upper openings 70 and 71.

Here, the areas of the first lower opening 60 and the second lower opening 80 may be 2.5 times or more larger than that of the semiconductor device.

In the exemplary embodiment of the present invention, it is preferable that the upper openings 70 and 71 and the lower openings 60 and 80 have sufficient areas to discharge heat, which is generated when power is applied, to serve as heat sinks themselves. In this case, the lead frame of the present invention requires no separate heat radiating means such as a heat sink.

In the lead frame, several electrodes are connected with each other and modulated into one so that several semiconductor chips may be attached. In the prior art, it is difficult to accomplish both a serial disposition and a parallel disposition of the electrodes with one module, while in the lead frame according to the exemplary embodiment of the present invention, it is possible. FIG. 5 is a diagram illustrating a state, in which electrodes are disposed in serial in the lead frame. FIG. 6 is a diagram illustrating a state, in which electrodes are disposed in parallel in the lead frame. In the present invention, it is possible to isolate the electrodes in serial or in parallel by using a position of the electrode isolating hole by adding the electrode isolating hole and specializing an internal pattern. Accordingly, contrary to the prior art, it is not necessary to separately make a serial isolating circuit and a parallel isolating circuit. Particularly, as illustrated in FIG. 5, when the electrode isolating hole 47 is formed by cutting a portion where the anode 10 and the cathode 20 are connected to each other, and then two electrode isolating holes 45 and 46 are formed per electrode, the anode and the cathode may be sequentially connected to form a serial circuit. In the meantime, as illustrated in FIG. 6, when one electrode isolating hole 47 is formed per electrode, the anode and the cathode may be connected in parallel to form a parallel circuit. As described above, in the exemplary embodiment of the present invention, it is possible to easily form a serial circuit and a parallel circuit by adjusting the position and the number of electrode isolating holes.

The present invention also provides an LED package or a semiconductor package including the lead frame.

Heat Radiating Characteristic

FIG. 7 illustrates heat radiating characteristics of the lead frames of the prior art and the present invention.

The lead frame in the prior art illustrated at a left side in FIG. 7 has a structure in which a printed circuit board (PCB) made of a metal or ceramic having high heat conductivity is designed based on one package including the semiconductor device (chip) and the lead frame, and then a heat sink made of a metal is attached onto a rear portion of the PCB. When power is applied from the outside and heat is generated in the lead frame package, the heat moves in order of the semiconductor chip, the lead frame, a solder, a PCB solder pad, the PCB, a thermal interface material (TIM), and the heat sink and is discharged to the outside. Here, the TIM represents a material, such as thermal grease, for decreasing contact resistance and improving heat conductivity. In the prior art lead frame, the heat generated in the package may be discharged to the air through the PCB and the heat sink.

On the other hand, the lead frame, illustrated at a right side in FIG. 7, includes the heat radiating holes, and includes the openings in the upper portion and the lower portion of the lead frame, thereby directly discharging heat to the outside through the heat radiating holes and the openings. When power is applied from the outside and heat is generated in the lead frame package, the heat moves from the semiconductor chip to the lead frame and is discharged to the outside. Specifically, the heat is discharged to the upper portion of the lead frame through the upper opening and the heat radiating hole, and is discharged to the lower portion of the lead frame through the first lower opening, the second lower opening, and the heat radiating hole. The reason is that a part of the anode 10 and the cathode 20 is in direct contact with the air through the openings and the heat radiating holes. Accordingly, the lead frame of the present invention may easily discharge heat even without the PCB and the heat sink. Particularly, the lead frame of the present invention is considerably effective in that heat may be discharged to both the upper portion and the lower portion.

Further, particularly, the lead frame according to the exemplary embodiment of the present invention enhances heat radiating efficiency by increasing a mounted area of the chip attachment part 50 in which heat is mainly generated. Accordingly, the lead frame according to the exemplary embodiment of the present invention exhibits an excellent heat radiating characteristic with high heat conductivity and low heat resistance.

The lead frame itself according to the exemplary embodiment of the present invention serves as a heat radiating means. So the lead frame does not need to include a separate heat radiating means or heat sink. Accordingly, it is possible to decrease costs and simplify a manufacturing process during the manufacturing of the lead frame. Further, a separate heat radiation design such as a heat sink is not required, so that it is possible to prevent the semiconductor device from being degraded, thereby guaranteeing reliability and efficiency even over long-time usage.

Further, the lead frame does not require a separate heat radiating means, PCB, and the like, so that it is possible to manufacture various types of products without a limitation in a shape of a product.

The lead frame according to the present invention has an excellent heat radiating characteristic when used for the semiconductor device and may effectively control a heat radiating characteristic, thereby improving performance and a quality of a product. Further, since a PCB and an additional heat radiation design are not required, an LED package or a semiconductor package product including the lead frame of the present invention may have low manufacturing costs and exhibit an excellent characteristic.

EXPLANATION OF REFERENCE NUMERALS AND SYMBOLS

10: Anode
20: Cathode
30: Molding part
40: Heat radiating hole
45, 46, 47, 48: Electrode isolating hole
50: Chip attachment part
55: Semiconductor chip
60: First lower opening
70, 71: Upper opening
80: Second lower opening
90: Male terminal part
91: Female terminal part
95, 95: Fastening hole

The invention claimed is:

1. A lead frame for preventing degradation of a semiconductor package, the lead frame comprising:
   a semiconductor package including a lead frame and a semiconductor device or semiconductor chip;
   one or more anodes and one or more cathodes which are disposed while being spaced apart from each other;
   a molding part which seals the anode and the cathode;
   terminal parts which are disposed at distal ends of the anode and the cathode, respectively;
   one or more heat radiating holes which are formed in an upper portion and a lower portion of the lead frame, and pass through the anode and/or the cathode, and the molding part;
   one or more chip attachment parts which are formed in the upper portion of the lead frame, the one or more chip attachment parts have a wider surface area than surface areas of the semiconductor chips to be attached to one or more chip attachment parts;
   one or more first upper openings which are formed in the upper portion of the molding part, and expose the anode or the cathode to the outside;
   one or more second upper opening, which are formed in the upper portion of the molding part, and which expose the anode or the cathode to the outside;
   one or more first lower openings, which are formed in the lower portion of the molding part at positions corresponding to the chip attachment parts in the lower portion of the lead frame, are not sealed by the molding part, and expose the anode or the cathode to the outside; and
   one or more second lower openings, which are formed in the lower portion of the molding part at positions corresponding to the second upper openings, and expose the anode or the cathode to the outside,
   wherein each of the one or more first and second upper openings and each of the one or more first and second lower openings have sufficient surface areas to discharge heat so that the lead frame itself functions as heat sinks when power is applied, and wherein the one or more heat radiating holes pass through each of the one or more second upper openings and each of the one or more second lower openings.

2. The lead frame of claim 1, further comprising:
   electrode isolating holes which are formed in a portion, in which the anode is adjacent to the cathode, simultaneously pass through the anode and/or the cathode, and the molding part, and electrically isolate the anode and the cathode.

3. The lead frame of claim 1, wherein areas of the first lower opening and the second lower opening are 2.5 times or more than an area of a semiconductor device.

4. The lead frame of claim 2, wherein the number of electrode isolating holes is two or more.

5. The lead frame of claim 2, wherein a diameter of the electrode isolating hole is 5 mm or less.

6. The lead frame of claim 1, wherein the anode and the cathode are fastened by a male-female fastening method.

7. The lead frame of claim 1, wherein one or more of the terminal parts include fastening holes.

8. The lead frame of claim 1, wherein the surface area of the chip attachment part is adjusted according to a heat radiating characteristic of the semiconductor chip to be attached.

9. The lead frame of claim 1, wherein the surface area of the chip attachment part is 2.5 times or more than a surface area of the semiconductor chip to be attached.

10. A semiconductor package comprising a semiconductor chip and the lead frame of any one of claim 1 which is electrically connected with the semiconductor chip.

11. A lighting apparatus comprising the semiconductor package of claim 10.

* * * * *